(12) United States Patent
Umeda et al.

(10) Patent No.: US 11,012,787 B2
(45) Date of Patent: May 18, 2021

(54) PIEZOELECTRIC ELEMENT, PIEZOELECTRIC MICROPHONE, PIEZOELECTRIC RESONATOR AND METHOD FOR MANUFACTURING PIEZOELECTRIC ELEMENT

(71) Applicant: Murata Manufacturing Co., Ltd., Nagaokakyo (JP)

(72) Inventors: Keiichi Umeda, Nagaokakyo (JP); Takaaki Mizuno, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 296 days.

(21) Appl. No.: 16/377,921

(22) Filed: Apr. 8, 2019

(65) Prior Publication Data

US 2019/0238996 A1 Aug. 1, 2019

Related U.S. Application Data

(63) Continuation of application No. 15/909,016, filed on Mar. 1, 2018, now Pat. No. 10,397,708, which is a
(Continued)

(30) Foreign Application Priority Data

Dec. 2, 2015 (JP) .............................. JP2015-235504

(51) Int. Cl.
*H01L 41/187* (2006.01)
*H04R 17/02* (2006.01)
(Continued)

(52) U.S. Cl.
CPC ............. *H04R 17/02* (2013.01); *H01L 41/09* (2013.01); *H01L 41/113* (2013.01);
(Continued)

(58) Field of Classification Search
CPC ..... H01L 41/09; H01L 41/113; H01L 41/187; H01L 41/257; H01L 41/316; H03H 9/173;
(Continued)

(56) References Cited

U.S. PATENT DOCUMENTS 2,439,499 A  4/1948 Williams
3,117,189 A  1/1964 Kopp
(Continued)

FOREIGN PATENT DOCUMENTS

JP  2644241 B2  8/1997
JP  2007-67125 A  3/2007
(Continued)

OTHER PUBLICATIONS

International Search Report issued for PCT/JP2016/084132, dated Jan. 31, 2017.
(Continued)

*Primary Examiner* — J. San Martin
(74) *Attorney, Agent, or Firm* — Arent Fox LLP

(57) ABSTRACT

A piezoelectric element includes a first piezoelectric layer which has a first polarization axis direction in a thickness direction of the first piezoelectric layer and is made of AlN. A second piezoelectric layer made of GeAlN which is deposited on the first piezoelectric layer and has a second polarization axis direction opposite to the first polarization axis direction. A first electrode is provided on a side of the first piezoelectric layer which is opposite from a side where the second piezoelectric layer is disposed. A second electrode provided on a side of the second piezoelectric layer which is opposite from a side where the first piezoelectric layer is disposed.

5 Claims, 5 Drawing Sheets

Related U.S. Application Data continuation of application No. PCT/JP2016/084132, filed on Nov. 17, 2016.

(51) Int. Cl.
| | |
|---|---|
| *H01L 41/316* | (2013.01) |
| *H03H 3/02* | (2006.01) |
| *H03H 9/02* | (2006.01) |
| *H03H 9/17* | (2006.01) |
| *H01L 41/113* | (2006.01) |
| *H04R 17/10* | (2006.01) |
| *H01L 41/09* | (2006.01) |
| *H01L 41/257* | (2013.01) |
| *H04R 31/00* | (2006.01) |

(52) U.S. Cl.
CPC ...... *H01L 41/1136* (2013.01); *H01L 41/1138* (2013.01); *H01L 41/187* (2013.01); *H01L 41/257* (2013.01); *H01L 41/316* (2013.01); *H03H 3/02* (2013.01); *H03H 9/02574* (2013.01); *H03H 9/173* (2013.01); *H03H 9/174* (2013.01); *H04R 17/10* (2013.01); *H04R 31/00* (2013.01)

(58) Field of Classification Search
CPC ...... H03H 9/174; H03H 9/02574; H03H 3/02; H04R 17/02; H04R 17/10; H04R 31/00
See application file for complete search history.

(56) References Cited

U.S. PATENT DOCUMENTS

| | | |
|---|---|---|
| 4,398,116 A | 8/1983 | Lewis |
| 2001/0011858 A1 | 8/2001 | Iino |
| 2003/0001514 A1 | 1/2003 | Kim |
| 2003/0117044 A1 | 6/2003 | Urano |
| 2003/0214379 A1 | 11/2003 | Satoh |
| 2009/0108710 A1 | 4/2009 | Brown |
| 2012/0169181 A1 | 7/2012 | Lee |
| 2012/0184854 A1 | 7/2012 | Raju |
| 2014/0015377 A1 | 1/2014 | Onishi |
| 2016/0372653 A1* | 12/2016 | Umeda .............. H01L 41/081 |
| 2017/0026754 A1 | 1/2017 | Buck |
| 2017/0272050 A1 | 9/2017 | Umeda et al. |
| 2018/0376251 A1 | 12/2018 | Tseng |
| 2019/0110132 A1 | 4/2019 | Littrell |
| 2021/0050506 A1* | 2/2021 | Xia .................. H01L 41/0815 |

FOREIGN PATENT DOCUMENTS

| | | |
|---|---|---|
| WO | WO 2015/133422 A1 | 9/2015 |
| WO | WO 2016/104004 A1 | 6/2016 |

OTHER PUBLICATIONS

Written Opinion of the International Searching Authority issued for PCT/JP2016/084132, dated Jan. 31, 2017.

* cited by examiner

… … …

PIEZOELECTRIC ELEMENT, PIEZOELECTRIC MICROPHONE, PIEZOELECTRIC RESONATOR AND METHOD FOR MANUFACTURING PIEZOELECTRIC ELEMENT

CROSS REFERENCE TO RELATED APPLICATIONS

The present application is a continuation of application Ser. No. 15/909,016, filed Mar. 1, 2018, which is a continuation of International application No. PCT/JP2016/084132, filed Nov. 17, 2016, which claims priority to Japanese Patent Application No. 2015-235504, filed Dec. 2, 2015, the entire contents of each of which are incorporated herein by reference.

TECHNICAL FIELD

The present invention relates to a piezoelectric element, a piezoelectric microphone, a piezoelectric resonator, and a method for manufacturing a piezoelectric element.

BACKGROUND OF THE INVENTION

Conventionally, piezoelectric microphones and piezoelectric sounding bodies using a piezoelectric element of a bimorph type have been widely used. A piezoelectric element of the bimorph type is obtained by joining two piezoelectric ceramic substrates together. Alternatively, a piezoelectric element of the bimorph type is obtained by integrally sintering a laminate in which two piezoelectric ceramic layers are laminated.

In order to omit the step of attaching or integral sintering, Japanese Patent Application Laid-Open No. 2007-067125 proposes a piezoelectric element of a bimorph type obtained by using a single piezoelectric layer. In the piezoelectric layer, the polarization axis direction of the portion on one main surface side from the central portion in the thickness direction and the polarization axis direction of the portion on the other main surface side from the central portion are opposite to each other.

In Japanese Patent Application Laid-Open No. 2007-067125, polarization is performed by applying an AC voltage from both sides of the piezoelectric layer after electrodes are formed on both main surfaces of the piezoelectric layer. Therefore, it is impossible to control the polarization axis direction of the piezoelectric layer with sufficiently high accuracy.

An object of the present invention is to provide a piezoelectric element of a bimorph type and a method for manufacturing the piezoelectric element, which are capable of making polarization axis directions of adjacent piezoelectric layers opposite to each other with high accuracy without an additional step such as polarization treatment. Another object of the present invention is to provide a piezoelectric microphone and a piezoelectric resonator having the piezoelectric element.

BRIEF DESCRIPTION OF THE INVENTION

A piezoelectric element according to the present invention includes: a first piezoelectric layer which has a first polarization axis direction in a thickness direction of the first piezoelectric layer and is made of AlN; a second piezoelectric layer which is deposited on the first piezoelectric layer, has a second polarization axis direction opposite to the first polarization axis direction and is made of GeAlN; a first electrode provided on a side of the first piezoelectric layer which is opposite from a side where the second piezoelectric layer is disposed: and a second electrode provided on a side of the second piezoelectric layer which is opposite from a side where the first piezoelectric layer is disposed.

In a specific aspect of the piezoelectric element according to the present invention, the second piezoelectric layer is directly deposited on the first piezoelectric layer. In this case, materials such as electrodes can be reduced, and the productivity can be effectively enhanced.

A piezoelectric microphone according to the present invention includes the piezoelectric element constituted according to the present invention and a support which supports the piezoelectric element from the side of the first piezoelectric layer so as to have a space where the piezoelectric element vibrates.

A piezoelectric resonator according to the present invention includes a piezoelectric element constituted according to the present invention and a support substrate provided on the side of the first piezoelectric layer of the piezoelectric element so as to have a space where the piezoelectric element vibrates.

A method for manufacturing a piezoelectric element according to the present invention includes the steps of: forming a first piezoelectric layer made of AlN by deposition so as to have a first polarization axis direction in a thickness direction of the first piezoelectric layer; forming a second piezoelectric layer made of GeAlN by deposition on the first piezoelectric layer so as to have a second polarization axis direction opposite to the first polarization axis direction; providing a first electrode on a side of the first piezoelectric layer which is opposite from a side where the second piezoelectric layer is disposed; and providing a second electrode on a side of the second piezoelectric layer which is opposite from a side where the first piezoelectric layer is disposed.

In a specific aspect of the method according to the present invention, the second piezoelectric layer is directly formed on the first piezoelectric layer in the step of forming the second piezoelectric layer. In this case, materials such as electrodes can be reduced, and the productivity can be effectively enhanced.

According to the present invention, it is possible to provide a piezoelectric element of a bimorph type and a method for manufacturing the piezoelectric element, which are capable of making the polarization axis directions of adjacent piezoelectric layers opposite to each other with high accuracy. Moreover, according to the present invention, it is possible to provide a piezoelectric microphone and a piezoelectric resonator having the piezoelectric element.

BRIEF DESCRIPTION OF DRAWINGS

FIG. 2(*b*) is a cross-sectional view along line II-II in FIG. 1.

DETAILED DESCRIPTION OF THE PREFERRED EMBODIMENTS

Several embodiments, which are examples of embodiments of the invention, are disclosed. Each embodiment described herein is illustrative and, without limitation, partial replacement or combination of configurations is possible between different embodiments.

Figure 1:
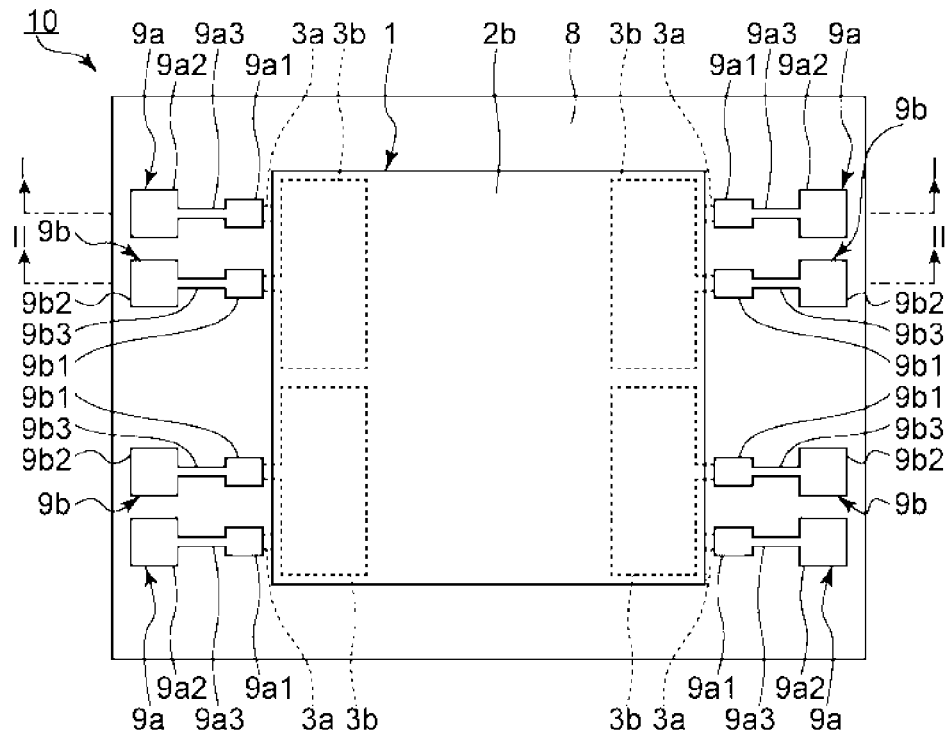
FIG. 1 is a plan view of a piezoelectric microphone according to a first embodiment of the present invention.
Figure 2:
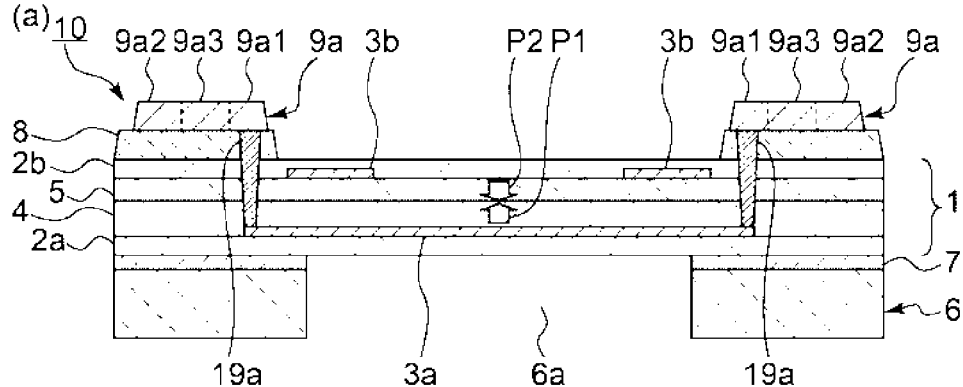
FIG. 2(*a*) is a cross-sectional view along line I-I in FIG. 1.
Figure 2:
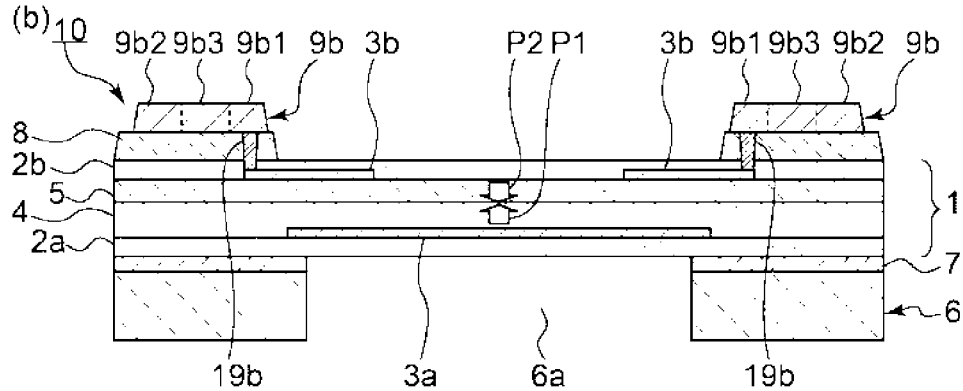

FIG. 1 is a plan view of a piezoelectric microphone according to a first embodiment of the present invention. FIG. 2(a) is a cross-sectional view along line I-I in FIG. 1. FIG. 2(b) is a cross-sectional view along line II-II in FIG. 1.

As shown in FIG. 2(a), a piezoelectric microphone 10 includes a piezoelectric element 1 of a bimorph type. The piezoelectric element 1 has a first protective layer 2a. In the present embodiment, the first protective layer 2a is made of AlN. Note that the first protective layer 2a may be made of appropriate ceramic or the like other than AlN.

On the first protective layer 2a, first electrodes 3a are provided. The first electrodes 3a are preferably made of Mo. By forming the first electrodes 3a made of Mo on the first protective layer 2a made of AlN by deposition, it is possible to improve the oriented state of the first electrodes 3a. Note that the first electrodes 3a may be made of an appropriate metal other than Mo. Alternatively, the first electrodes 3a may be made of a semiconductor material such as Si.

A first piezoelectric layer 4 is formed on the first protective layer 2a by deposition so as to cover the first electrodes 3a. The first piezoelectric layer 4 has a first polarization axis direction P1 in a thickness direction. The first piezoelectric layer 4 is preferably made of AlN.

On the first piezoelectric layer 4, a second piezoelectric layer 5 is formed by deposition. The second piezoelectric layer 5 has a second polarization axis direction P2 opposite to the first polarization axis direction P1. The second piezoelectric layer 5 is preferably made of GeAlN. Thus, the piezoelectric element 1 is a bimorph type piezoelectric element.

On the second piezoelectric layer 5, a plurality of second electrodes 3b are provided. Note that the number of the second electrodes 3b is not particularly limited. The plurality of second electrodes 3b are not particularly limited, but made of Mo. In this way, the second electrodes 3b are provided on a side of the second piezoelectric layer 5 which is opposite from a side where the first piezoelectric layer 4 is disposed. On the other hand, the first electrodes 3a are provided on a side of the first piezoelectric layer 4 which is opposite from a side where the second piezoelectric layer 5 is disposed.

A second protective layer 2b is laminated on the second piezoelectric layer 5 so as to cover the plurality of second electrodes 3b. The second protective layer 2b is not particularly limited, but may be made of AlN.

The piezoelectric microphone 10 has a support 6 which supports the piezoelectric element 1 from the side of (i.e., from below as shown in FIG. 2(a)) the first protective layer 2a. The piezoelectric element 1 is preferably provided on the support 6 with a first insulator layer 7 interposed therebetween. The support 6 is made of an appropriate material such as Si. The first insulator layer 7 is not particularly limited, but may be made of SiO2.

The support 6 supports the piezoelectric element 1 so as to have a space where the piezoelectric element 1 vibrates. More specifically, the support 6 has a cavity 6a in the present embodiment. As a result, the space is formed. A sound wave propagates from the outside to the piezoelectric element 1, thereby vibrating the piezoelectric element 1 in the space.

Note that the shape and the number of the support 6 are not particularly limited. For example, the piezoelectric element 1 may be supported by a plurality of supports 6, and the space may be formed.

A second insulator layer 8 is provided on the second protective layer 2b of the piezoelectric element 1. As shown in FIG. 1, the second insulator layer 8 is provided so as to surround the plurality of second electrodes 3b in planar view. The second insulator layer 8 is not particularly limited, but may be made of SiO2.

On the second insulator layer 8, a plurality of first and second external electrodes 9a and 9b are provided. As shown in FIG. 2(a), the piezoelectric element 1 has first via electrodes 19a which are electrically connected to the first electrodes 3a of the piezoelectric element 1 with the first via electrodes 19a interposed therebetween.

More specifically, the first external electrodes 9a have first and second terminals 9a1 and 9a2. The first external electrodes 9a also have connection electrodes 9a3 which connect the first and second terminals 9a1 and 9a2. Note that the broken lines in the first external electrodes 9a in FIG. 2(a) indicate the boundaries between the first and second terminals 9a1 and 9a2 and the connection electrodes 9a3. One end of each of the first via electrodes 19a is connected to a respective first terminal 9a1. Each of the first via electrodes 19a penetrate the second insulator layer 8, the second protective layer 2b, the second piezoelectric layer 5 and the first piezoelectric layer 4 so that the other ends of the first via electrodes 19a are connected to the first electrodes 3a. The second terminals 9a2 are electrically connected to the outside (e.g., to an external circuit).

Similarly, as shown in FIG. 2(b), the piezoelectric element 1 has second via electrodes 19b. Each of the second external electrodes 9b is electrically connected to the second electrodes 3b with the second via electrodes 19b interposed therebetween. Note that, similarly to the first external electrodes 9a, the second external electrodes 9b have first and second terminals 9b1 and 9b2. The second external electrodes 9b also have connection electrodes 9b3 which connect the first and second terminals 9b1 and 9b2. Note that the broken lines in the second external electrodes 9b in FIG. 2(b) indicate the boundaries between the first and second terminals 9b1 and 9b2 and the connection electrodes 9b3.

In the piezoelectric microphone 10, the piezoelectric element 1 is vibrated by a sound wave hitting its surface and generates an electric signal in response thereto. The electric signal is outputted from the piezoelectric element 1.

Note that, as shown in FIG. 1, parts of the first and second electrodes 3a and 3b preferably include extension portions which overlap with the first and second external electrodes 9a and 9b in planar view. The extension portions of the first and second electrodes 3a and 3b are preferably connected to the first and second external electrodes 9a and 9b, respectively. As a result, the vibration of the piezoelectric element 1 is hard to be disturbed.

As shown in FIG. 2(a), the second piezoelectric layer 5 is preferably made of GeAlN and is formed by deposition on the first piezoelectric layer 4 which is preferably made of AlN so as to have the second polarization axis direction P2 extend in a direction opposite to the first polarization axis direction P1. As a result, the polarization axis directions of the adjacent first and second piezoelectric layers 4 and 5 can be opposite to each other with high accuracy. This will be described together with a method for manufacturing the piezoelectric element 1 in the present embodiment.

Figure 3:
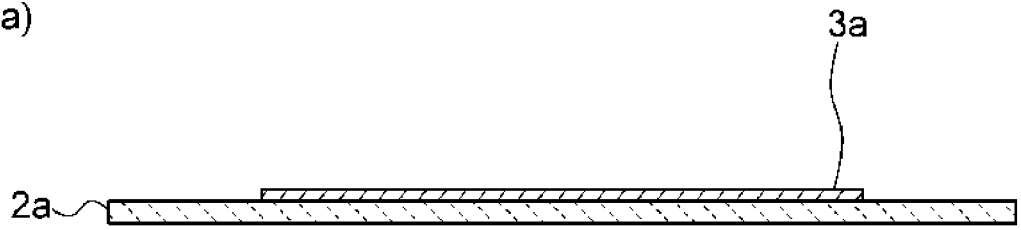
FIGS. 3(*a*) to 3(*d*) are front cross-sectional views for illustrating a method for manufacturing a piezoelectric element according to the first embodiment of the present invention.
Figure 3:
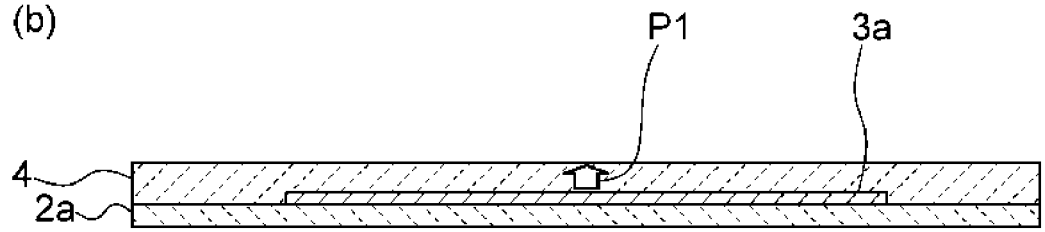
Figure 3:
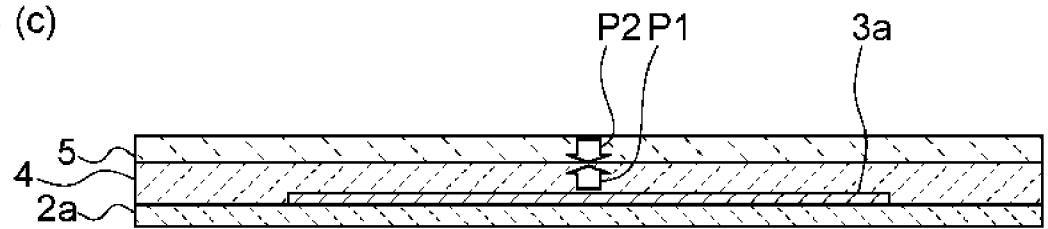
Figure 3:
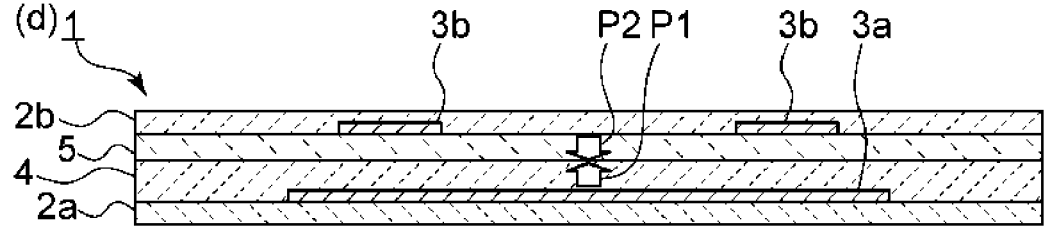

FIGS. 3(a) to 3(d) are front cross-sectional views for illustrating a method for manufacturing the piezoelectric element in the first embodiment. As shown in FIG. 3(a), the first protective layer 2a is prepared. Next, the first electrode 3a is formed on the first protective layer 2a. The first electrode 3a can be provided by, for example, a sputtering method, a CVD method or the like.

Next, as shown in FIG. 3(b), the first piezoelectric layer 4, preferably made of AlN, is formed on the first protective layer 2a so as to cover the first electrode 3a. At this time, the first piezoelectric layer 4 is preferably formed by deposition so that the first piezoelectric layer 4 has the first polarization axis direction P1. Examples of possible deposition methods include a sputtering method and a CVD method. Thus, when the first piezoelectric layer 4 is formed, the first piezoelectric layer 4 has the first polarization axis direction P1.

Next, as shown in FIG. 3(c), the second piezoelectric layer 5, preferably made of GeAlN, is formed on the first piezoelectric layer 4. At this time, the second piezoelectric layer 5 is formed by deposition so that the second piezoelectric layer 5 has the second polarization axis direction P2 opposite to the first polarization axis direction P1. As a result, when the second piezoelectric layer 5 is formed, the second piezoelectric layer 5 has the second polarization axis direction P2. Examples of deposition methods that can be used include a sputtering method and a CVD method. Particularly for GeAlN, a GeAl alloy target or a sintered target may be used, or two targets of Ge and Al may be used.

Herein, the polarization axis direction of the layer made of GeAlN is hardly influenced by the polarization axis direction of the layer made of AlN or the like, which is the base for forming this layer. Thus, even when the second piezoelectric layer 5 is formed on the first piezoelectric layer 4, polarization inversion of the second piezoelectric layer 5 hardly occurs. Therefore, the polarization axis directions of the first and second piezoelectric layers 4 and 5 can be opposite to each other with a high degree of accuracy. Moreover, as described above, since the second piezoelectric layer 5 may be formed on the first piezoelectric layer 4 by deposition, the polarization axis directions can be easily controlled.

In the manufacture of the piezoelectric element 1 in the present embodiment, the second piezoelectric layer 5 is directly formed on the first piezoelectric layer 4. Thus, materials such as electrodes can be reduced. In addition, since the step of joining the first and second piezoelectric layers 4 and 5 or the like is unnecessary, the productivity can be effectively enhanced.

The second piezoelectric layer 5 may be formed on the first piezoelectric layer 4 which is individually prepared. In this case, after the laminate of the first and second piezoelectric layers 4 and 5 is obtained, the first electrode 3a and the first protective layer 2a should be provided on the side of the first piezoelectric layer 4, the side being opposite from a side where the second piezoelectric layer 5 is disposed.

Next, as shown in FIG. 3(d), the second electrodes 3b are provided on the second piezoelectric layer 5. Next, the second protective layer 2b is provided on the second piezoelectric layer 5 so as to cover the second electrodes 3b.

A thin film made of SiO2, Al2O3 or the like other than the electrodes may be laminated between the first and second piezoelectric layers 4 and 5. However, as in the present embodiment, the second piezoelectric layer 5 is preferably directly formed on the first piezoelectric layer 4.

Figure 4:
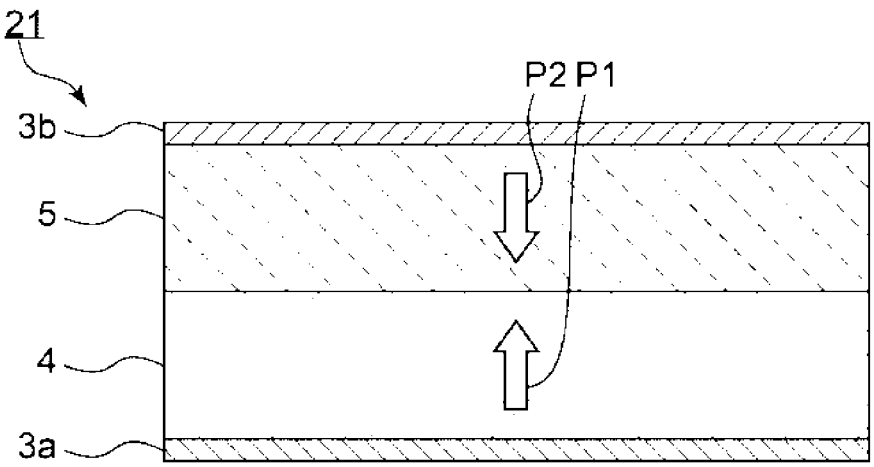
FIG. 4 is a schematic front cross-sectional view of a piezoelectric element according to a second embodiment of the present invention.

FIG. 4 is a schematic front cross-sectional view of a piezoelectric element according to a second embodiment. In this embodiment, a piezoelectric element 21 is different from the piezoelectric element 1 of the first embodiment in that the piezoelectric element 21 does not have the first and second protective layers.

In this case, it is also possible to control the polarization axis directions of first and second piezoelectric layers 4 and 5 with high accuracy.

However, as in the first embodiment shown in FIGS. 2(a) and 2(b), it is more preferable to provide first and second protective layers 2a and 2b. As a result, breakage of first and second electrodes 3a and 3b and degradation of the characteristics of the piezoelectric element 1 rarely occur.

Herein, a plurality of piezoelectric elements having the configuration of the second embodiment and piezoelectric elements of first and second comparative examples shown in the following FIGS. 5 and 6 were created with different thicknesses. The sensitivity was compared by measuring the output voltage of each piezoelectric element.

Figure 5:
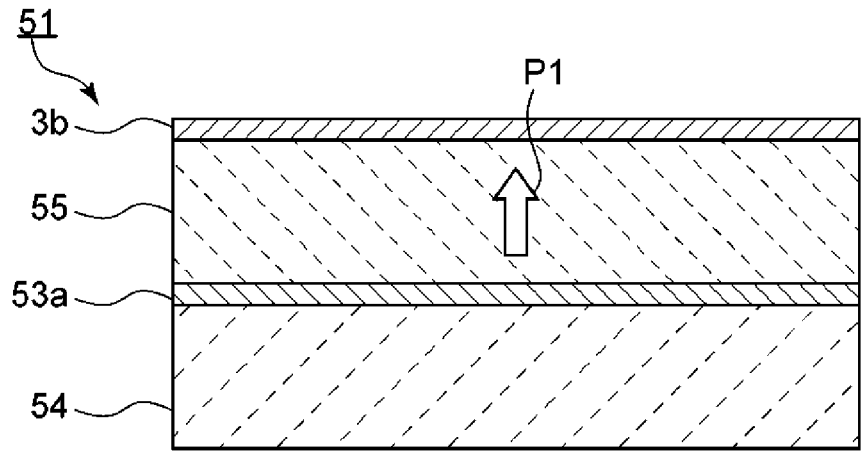
FIG. 5 is a schematic front cross-sectional view of a piezoelectric element of a first comparative example.

FIG. 5 is a schematic front cross-sectional view of a piezoelectric element of the first comparative example. In a piezoelectric element 51, the configuration of the portions corresponding to the first and second piezoelectric layers and the arrangement of the first electrodes in the second embodiment are different from those in the second embodiment.

More specifically, the piezoelectric element 51 has a first layer 54 made of AlN which is not a piezoelectric body. A first electrode 53a is provided on the first layer 54.

On the first electrode 53a, a second layer 55 made of AlN which is a piezoelectric body is laminated. The second layer 55 has a first polarization axis direction P1. Except for the above points, the piezoelectric element 51 has the same configuration as the piezoelectric element 21 of the second embodiment.

Figure 6:
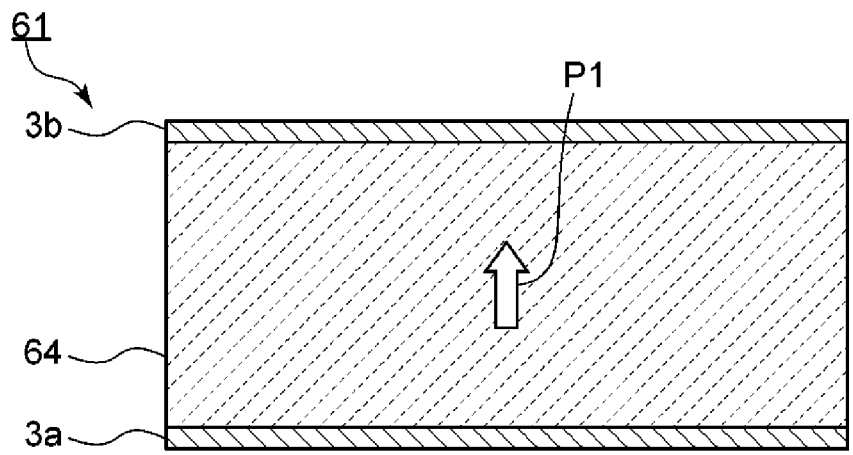
FIG. 6 is a schematic front cross-sectional view of a piezoelectric element of a second comparative example.

FIG. 6 is a schematic front cross-sectional view of a piezoelectric element of the second comparative example. In this embodiment the piezoelectric element 61 is different from the piezoelectric element 21 of the second embodiment in that a piezoelectric layer 64 is a single layer. Note that the piezoelectric layer 64 is made of AlN and has the first polarization axis direction P1. Except for the above points, the piezoelectric element 61 has the same configuration as the piezoelectric element 21 of the second embodiment.

Note that the thicknesses of the first and second piezoelectric layers in the created piezoelectric element having the configuration of the second embodiment were the same.

The thicknesses of the first and second layers in the piezoelectric element of the first comparative example were also the same.

Figure 7:
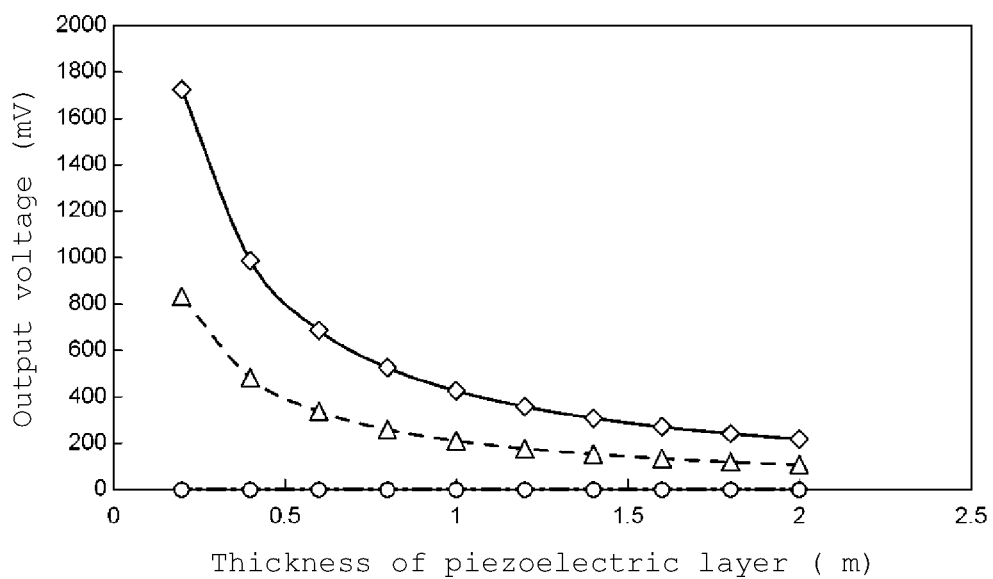
FIG. 7 is a plot showing a relationship between thicknesses of piezoelectric layers of the second embodiment and the first and second comparative examples and an output voltage.

FIG. 7 is a plot showing the relationship between the thicknesses of the piezoelectric layers of the second embodiment and the first and second comparative examples and the output voltage. The rhomboid marks and solid line indicate the results of the second embodiment. The triangle marks and broken line indicate the results of the first comparative example. The circular marks and dashed line indicate the results of the second comparative example. Note that the thickness of the piezoelectric layer on the horizontal axis in FIG. 7 is the total thickness of the first and second piezoelectric layers in the second embodiment. In the first comparative example, the thickness is the total thickness of the first and second layers. In the second comparative example, the thickness is the thickness of the single layer 64.

As shown in FIG. 7, when piezoelectric elements with the same thickness are compared, the output voltage of the second embodiment is higher than that of the first and second comparative examples. Therefore, according to the second embodiment, it can be seen that the sensitivity of the piezoelectric element can be enhanced.

Figure 8:
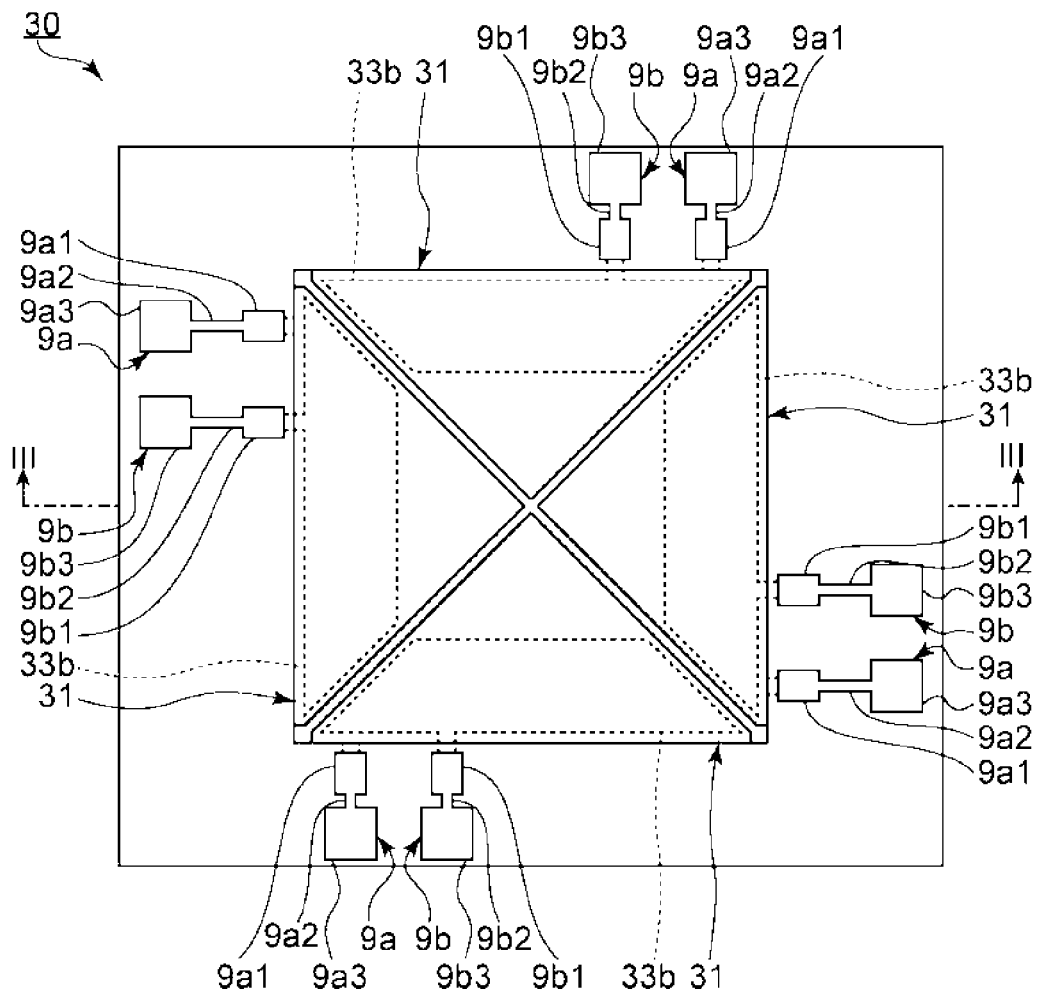
FIG. 8 is a plan view of a piezoelectric microphone according to a third embodiment of the present invention.
Figure 9:
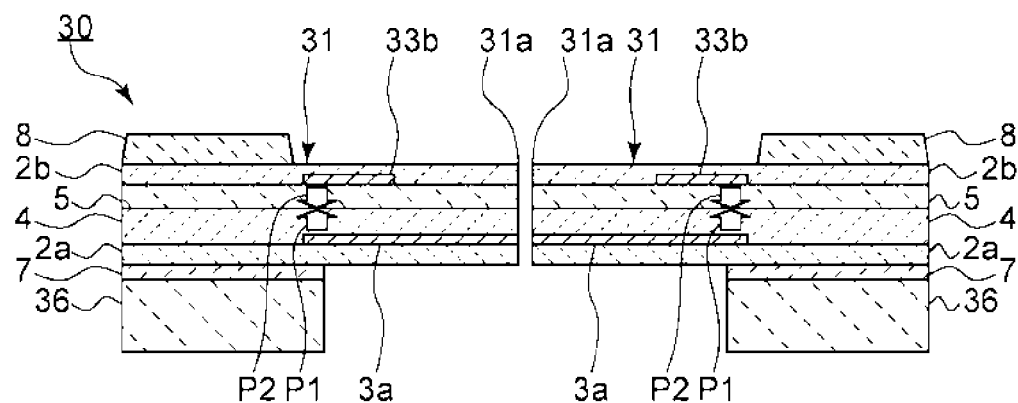
FIG. 9 is a cross-sectional view along line III-III in FIG. 8.

FIG. 8 is a plan view of a piezoelectric microphone according to a third embodiment. FIG. 9 is a cross-sectional view along line III-III in FIG. 8.

As shown in FIG. 9, a piezoelectric microphone 30 is different from the piezoelectric microphone 10 of the first embodiment in that each piezoelectric element 31 has an open end portion 31a not fixed by a support 36. Accordingly, as shown in FIG. 8, the arrangement of first and second external electrodes 9a and 9b in planar view and the planar shape of each piezoelectric element 31 are also different from those of the first embodiment. Except for the above points, the piezoelectric microphone 30 has the same configuration as the piezoelectric microphone 10 of the first embodiment.

More specifically, the piezoelectric microphone 30 has the four piezoelectric elements 31. Each of the piezoelectric elements 31 has a substantially triangular planar shape. Second electrodes 33b have substantially trapezoidal planar shapes. Three sides among the substantially trapezoidal sides of the second electrodes 33b extend along each side of the piezoelectric elements 31 in planar view. Note that the planar shapes of the piezoelectric elements 31 and the second electrodes 33b are not particularly limited.

As shown in FIG. 9, the piezoelectric elements 31 are cantilevered on the supports 36 and have the open end distal portions 31a. Therefore, the piezoelectric elements 31 can be suitably vibrated. Moreover, also in the present embodiment, as in the first embodiment, it is possible to control the polarization axis directions of first and second piezoelectric layers 4 and 5 with high accuracy.

Figure 10:
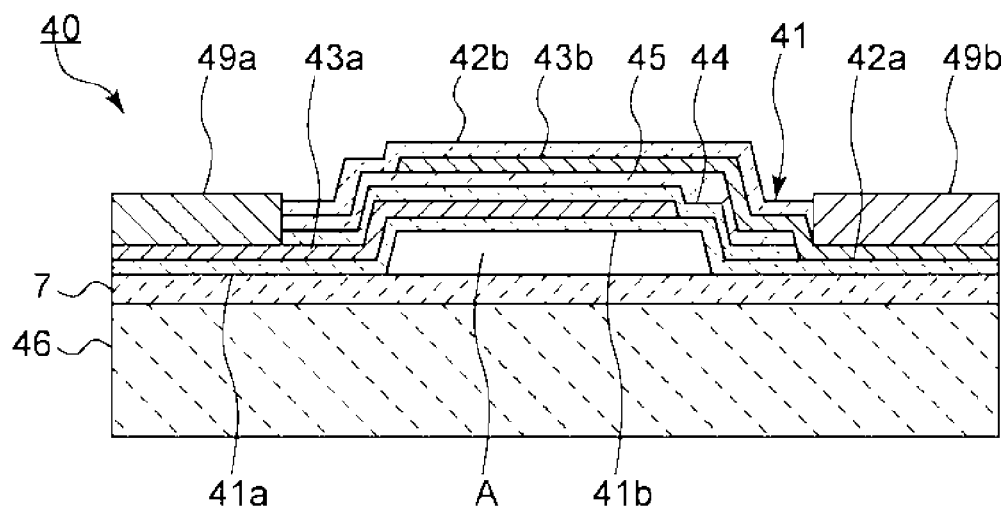
FIG. 10 is a front cross-sectional view of a piezoelectric resonator according to a fourth embodiment of the present invention.

FIG. 10 is a front cross-sectional view of a piezoelectric resonator according to a fourth embodiment.

A piezoelectric resonator 40 has a support substrate 46 having a tabular shape. In the present embodiment, the support substrate 46 is preferably a high resistance Si substrate. More specifically, the resistivity of the support substrate 46 is 1000 Ω·cm or more. Note that the material of the support substrate is not particularly limited.

The piezoelectric resonator 40 has a piezoelectric element 41 which, as in the first embodiment, is preferably a laminate in which a first protective layer 42a, a first electrode 43a, a first piezoelectric layer 44, a second piezoelectric layer 45, a second electrode 43b and a second protective layer 42b are laminated. The support substrate 46 is provided on the side of the first protective layer 42a of the piezoelectric element 41. Note that the support substrate 46 may be provided with a first insulator layer 7 interposed therebetween as shown in FIG. 10.

The piezoelectric element 41 and the support substrate 46 are bonded so as to have a space A where the piezoelectric element 41 vibrates. More specifically, the piezoelectric element 41 has a bond portion 41a bonded to the support substrate 46. Moreover, each layer of the piezoelectric element 41 is partially bent so as to move away from the support substrate 46 in a height direction. As a result, the space A is formed. The piezoelectric element 41 has a vibration portion 41b opposed to the support substrate 46 with the space A interposed therebetween. In the piezoelectric resonator 40, the vibration portion 41b of the piezoelectric element 41 vibrates.

Note that the shape of each layer of the piezoelectric element 41 and the shape of the support substrate 46 are not particularly limited as long as the space A is formed.

The piezoelectric resonator 40 may have a first electrode pad 49a connected to the first electrode 43a and a second electrode pad 49b connected to the second electrode 43b. The piezoelectric resonator 40 can be electrically connected to the outside with the first and second electrode pads 49a and 49b interposed therebetween.

When the piezoelectric element in which the piezoelectric layer is a single layer made of AlN is used for the piezoelectric resonator as in the second comparative example shown in FIG. 6, by a fundamental wave drive, a thickness longitudinal vibration is excited, for example. On the other hand, in the piezoelectric resonator 40 of the present embodiment, when the thickness of the piezoelectric element 41 is the same as the thickness of the piezoelectric element of the second comparative example, a second order harmonic of the thickness longitudinal vibration in the second comparative example can be efficiently excited. Thus, in the piezoelectric resonator 40, high frequencies can be excited efficiently. Therefore, the piezoelectric resonator 40 can be suitably used, for example, for an RF filter, a duplexer or the like in which a pass band is located at 5 GHz or more.

Figure 11:
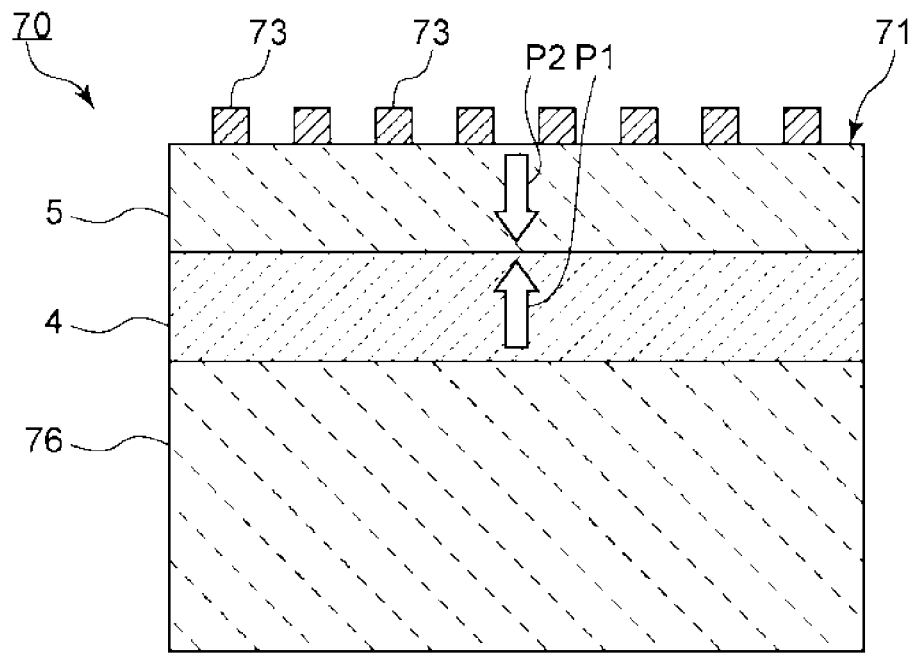
FIG. 11 is a front cross-sectional view of an elastic wave device according to a fifth embodiment of the present invention.

FIG. 11 is a front cross-sectional view of an elastic wave device according to a fifth embodiment.

An elastic wave device 70 has a piezoelectric element 71. In the piezoelectric element 71, similarly to the piezoelectric element 1 in the first embodiment, a second piezoelectric layer 5 made of GeAlN is formed by deposition on a first piezoelectric layer 4 made of AlN. On the second piezoelectric layer 5, IDT electrodes 73 are provided.

Meanwhile, the elastic wave device 70 has a support substrate 76. The support substrate 76 is not particularly limited, but made of Si, sapphire or the like. The support substrate 76 is provided on the side of the first piezoelectric layer 4 of the piezoelectric element 71.

Conventionally, an elastic wave device using a piezoelectric body made of a single AlN layer or a piezoelectric body made of a single ScAlN layer has been studied. The elastic wave device uses a Sezawa wave which is a second order harmonic of a Rayleigh wave.

Herein, the elastic wave device 70 of the present embodiment can efficiently excite the second order harmonic of a reference elastic wave. Therefore, the Sezawa wave can also be efficiently excited, and the coupling coefficient can be increased.

DESCRIPTION OF REFERENCE SYMBOLS

1: Piezoelectric element
2a, 2b: First and second protective layer 3a, 3b: First and second electrode
4, 5: First and second piezoelectric layer
6: Support
6a: Cavity
7, 8: First and second insulator layer
9a, 9b: First and second external electrode
9a1, 9a2: First and second terminal
9a3: Connection electrode
9b1, 9b2: First and second terminal
9b3: Connection electrode
10: Piezoelectric microphone
19a, 19b: First and second via electrode
21: Piezoelectric element
30: Piezoelectric microphone
31: Piezoelectric element
31a: Open end portion
33b: Second electrode
36: Support
40: Piezoelectric resonator
41: Piezoelectric element
41a: Bond portion
41b: Vibration portion
42a, 42b: First and second protective layer
43a, 43b: First and second electrode
44, 45: First and second piezoelectric layer
46: Support substrate
49a, 49b: First and second electrode pad
51: Piezoelectric element
53a: First electrode
54, 55: First and second layer
61: Piezoelectric element
64: Piezoelectric layer
70: Elastic wave device
71: Piezoelectric element
73: IDT electrode
76: Support substrate

The invention claimed is:

1. A piezoelectric element, comprising:

a first piezoelectric layer which has a first polarization axis direction in a thickness direction of the first piezoelectric layer and is made of AlN;

a second piezoelectric layer which is deposited on the first piezoelectric layer, has a second polarization axis direction opposite to the first polarization axis direction and is made of GeAlN;

a first electrode provided on a side of the first piezoelectric layer which is opposite from a side where the second piezoelectric layer is disposed: and a second electrode provided on a side of the second piezoelectric layer which is opposite from a side where the first piezoelectric layer is disposed.

2. The piezoelectric element according to claim 1, wherein the second piezoelectric layer is directly deposited on the first piezoelectric layer.

3. A piezoelectric device, comprising:

the piezoelectric element according to claim 1; and a support which supports the piezoelectric element from a side of the first piezoelectric layer so as to have a space where the piezoelectric element vibrates.

4. A method for manufacturing a piezoelectric element, the method comprising the steps of:

forming a first piezoelectric layer made of AlN by deposition so as to have a first polarization axis direction in a thickness direction of the first piezoelectric layer;

forming a second piezoelectric layer made of GeAlN by deposition on the first piezoelectric layer so as to have a second polarization axis direction opposite to the first polarization axis direction;

providing a first electrode on a side of the first piezoelectric layer which is opposite from a side where the second piezoelectric layer is disposed; and providing a second electrode on a side of the second piezoelectric layer which is opposite from a side where the first piezoelectric layer is disposed.

5. The method according to claim 4, wherein the second piezoelectric layer is directly formed on the first piezoelectric layer in the step of forming the second piezoelectric layer.

\* \* \* \* \*